US012706612B2

(12) United States Patent
Ngo

(10) Patent No.: US 12,706,612 B2
(45) Date of Patent: Aug. 11, 2026

(54) SEMICONDUCTOR INTEGRATED CIRCUIT AND RECEIVER DEVICE

(71) Applicant: Kioxia Corporation, Tokyo (JP)

(72) Inventor: Huy Cu Ngo, Isehara (JP)

(73) Assignee: Kioxia Corporation, Tokyo (JP)

(*) Notice: Subject to any disclaimer, the term of this patent is extended or adjusted under 35 U.S.C. 154(b) by 21 days.

(21) Appl. No.: 18/742,244

(22) Filed: Jun. 13, 2024

(65) Prior Publication Data

US 2024/0421807 A1 Dec. 19, 2024

(30) Foreign Application Priority Data

Jun. 19, 2023 (JP) ................................ 2023-100263

(51) Int. Cl.
*H03M 1/12* (2006.01)
*G11C 27/02* (2006.01)

(52) U.S. Cl.
CPC ......... *H03M 1/1245* (2013.01); *G11C 27/024* (2013.01); *H03M 1/1215* (2013.01)

(58) Field of Classification Search
CPC .. H03M 1/1215; H03M 1/1245; G11C 27/024
See application file for complete search history.

(56) References Cited

U.S. PATENT DOCUMENTS 7,015,729 B1 * 3/2006 Tursi .................... G11C 27/024 327/94
7,015,842 B1 * 3/2006 Gupta .................. G11C 27/024 341/122
10,911,060 B1 * 2/2021 Neto ...................... G11C 27/02
10,985,772 B2 * 4/2021 Waki ..................... H03M 1/124
11,082,054 B1 * 8/2021 Cascio ................ H03M 1/0697
11,533,060 B2 * 12/2022 Lee ..................... H03M 1/1235

(Continued)

FOREIGN PATENT DOCUMENTS

JP 2008072406 A 3/2008
JP 2009272915 A 11/2009
JP 2017158043 A 9/2017

OTHER PUBLICATIONS

Im et al., "A 112-Gb/s PAM-4 Long-Reach Wireline Transceiver Using a 36-Way Time-Interleaved SAR ADC and Inverter-Based RX Analog Front-End in 7-nm FinFET", IEEE Journal of Solid-State Circuits, IEEE, Sep. 25, 2020, vol. 56, No. 1, pp. 7-18.

(Continued)

*Primary Examiner* — Patrick O'Neill
(74) *Attorney, Agent, or Firm* — Maier & Maier, PLLC

(57) ABSTRACT

According to one embodiment, a semiconductor integrated circuit includes: a first buffer including an input end to which a first signal is configured to be supplied; a first switching element including a first end coupled to an output end of the first buffer and a second end coupled to a first node; a first capacitor including a first end coupled to the first node and a grounded second end; a second switching element including a first end coupled to the first node and a second end coupled to a second node; a second buffer including an input end coupled to the second node; and a first converter configured to determine a first bit string from a first output from the second buffer. The first and second switching elements being configured to switch between states based on a first clock signal.

18 Claims, 7 Drawing Sheets

(56) References Cited

U.S. PATENT DOCUMENTS

| | | | | |
|---|---|---|---|---|
| 2009/0278716 | A1 | 11/2009 | Kawahito et al. | |
| 2014/0045444 | A1* | 2/2014 | Furuta | H04B 1/16<br>327/91 |
| 2019/0131990 | A1* | 5/2019 | Ali | H03M 1/0639 |

OTHER PUBLICATIONS

Khairi et al., "A 1.14-pJ/b 224-GB/s PAM4 6-bit ADC-Based SerDes Receiver With Hybrid AFE Capable of Supporting Long Reach Channels", IEEE Journal of Solid-State Circuits, IEEE, Oct. 26, 2022, vol. 58, No. 1, pp. 8-18.

* cited by examiner

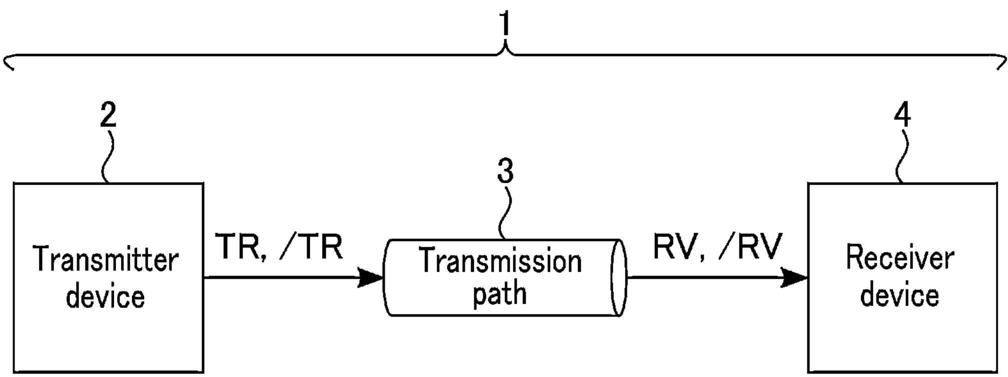
F I G. 1
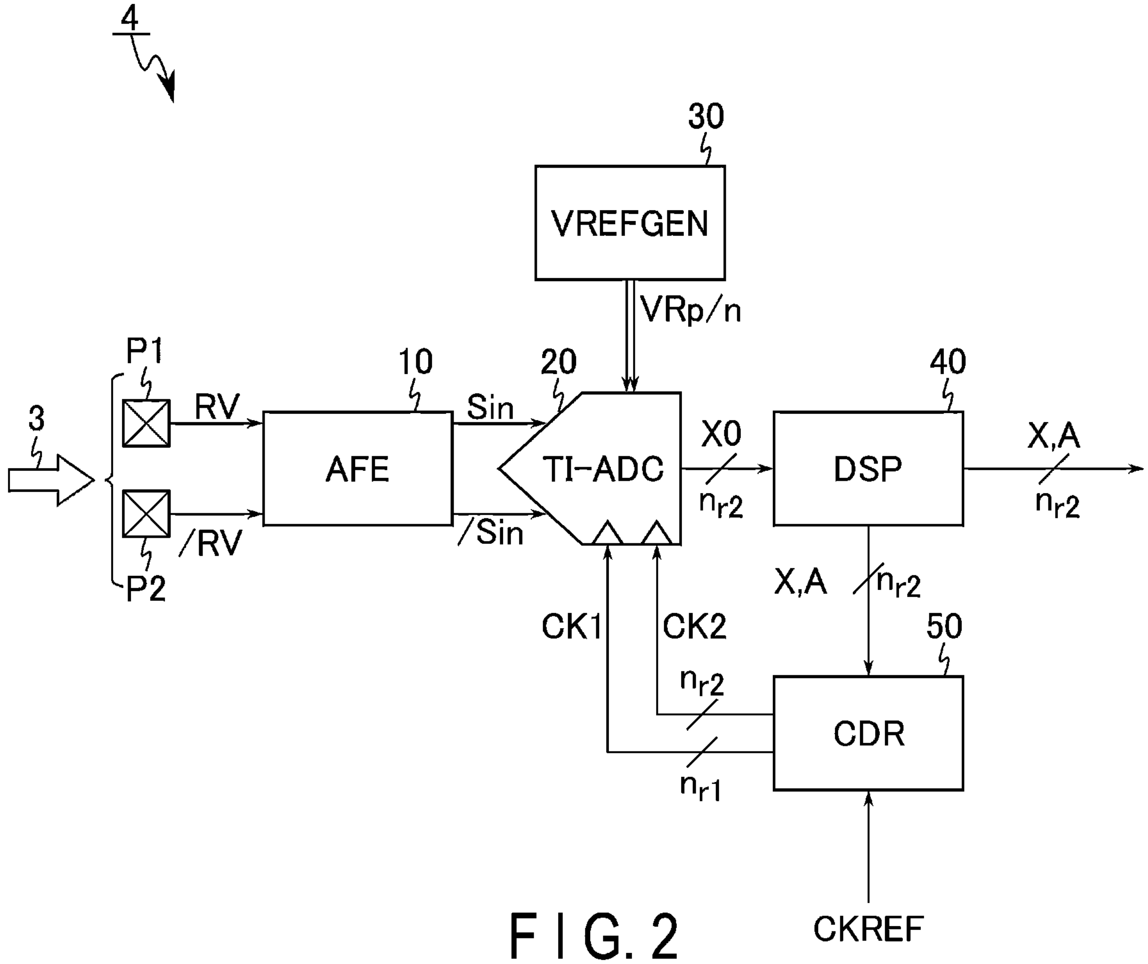
F I G. 2

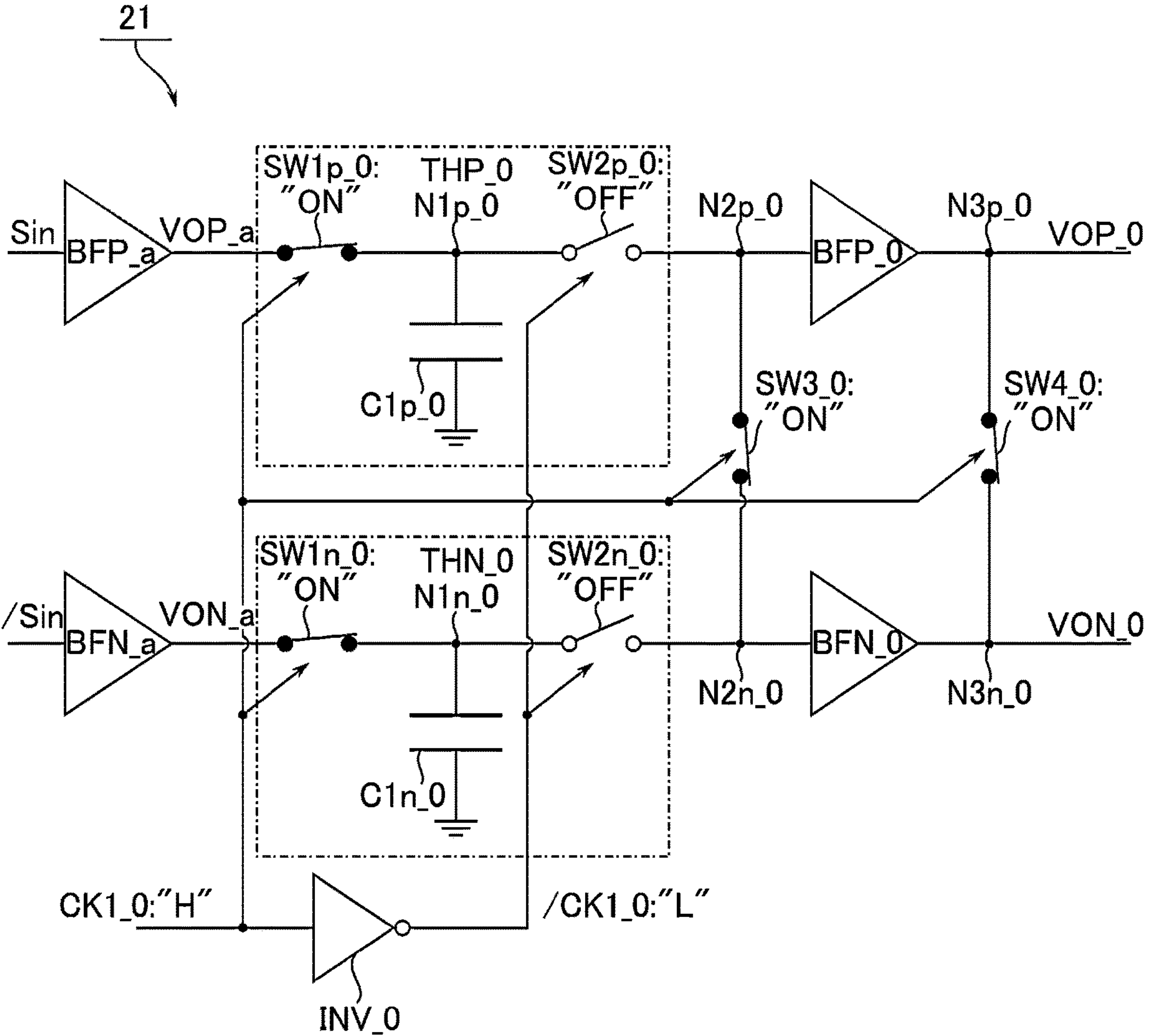
F I G. 5

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2023-100263, filed Jun. 19, 2023, the entire contents of which are incorporated herein by reference.

FIELD

Embodiments described herein relate generally to a semiconductor integrated circuit and a receiver device.

BACKGROUND

A transmitter device and a receiver device are coupled via a transmission path. The transmitter device superimposes data on an analog signal, and outputs the analog signal. The receiver device receives the analog signal that has passed through the transmission path. The receiver device includes a semiconductor integrated circuit configured to process the analog signal. The receiver device generates a digital signal based on the analog signal. The receiver device recovers data based on the generated digital signal.

BRIEF DESCRIPTION OF THE DRAWINGS

FIG. 1 is a block diagram showing an example of a configuration of a communication system including a receiver device according to an embodiment.

FIG. 2 is a block diagram showing an example of a configuration of a receiver circuit included in the receiver device according to the embodiment.

FIG. 5 is a diagram showing an example of track processing of a signal in the sampling front end included in the AD converter according to the embodiment.

DETAILED DESCRIPTION

Figure 3:
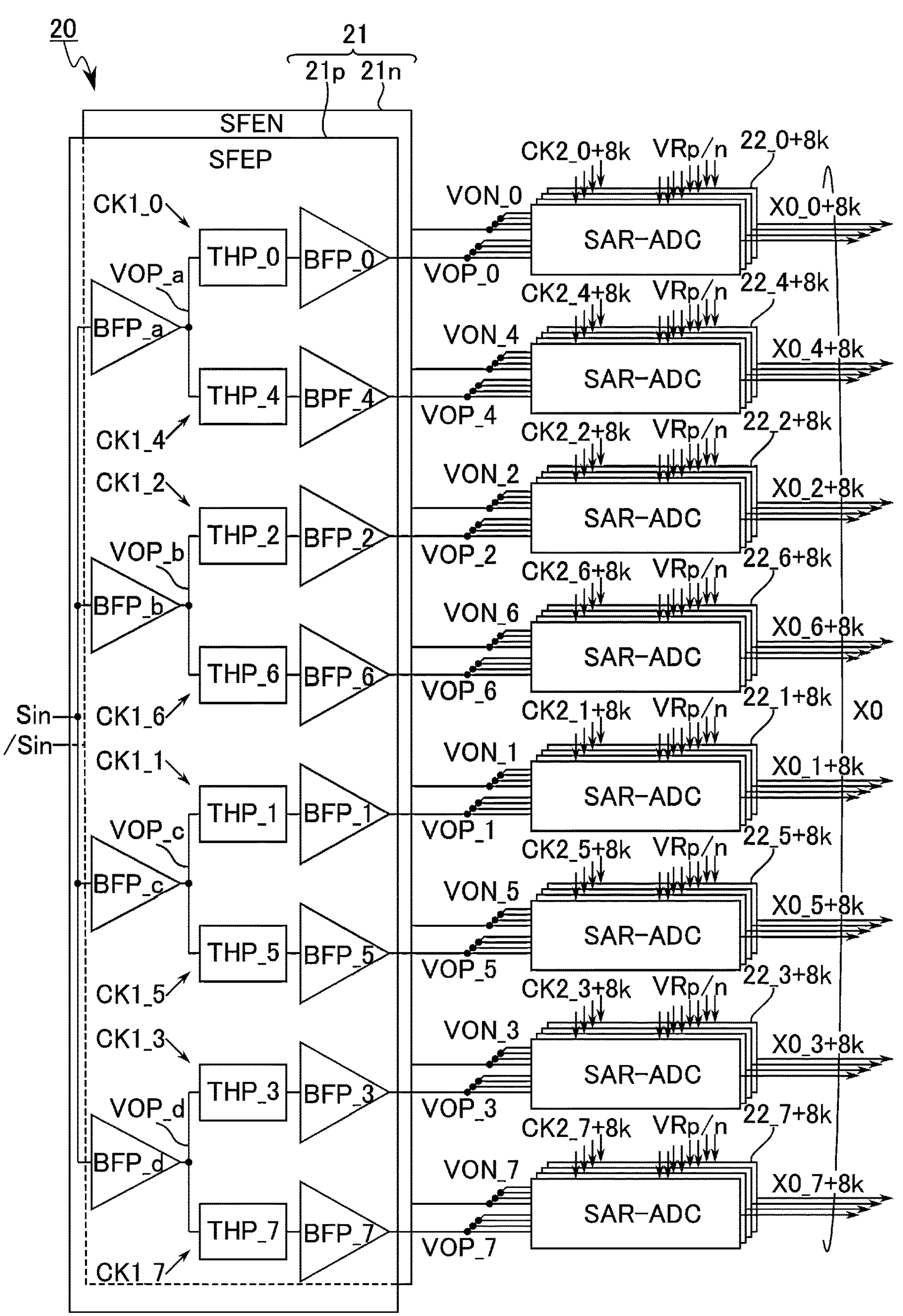
FIG. 3 is a block diagram showing an example of a configuration of an AD converter included in the receiver circuit according to the embodiment.

In general, according to one embodiment, a semiconductor integrated circuit includes a first buffer including an input end to which a first signal is configured to be supplied; a first switching element including a first end coupled to an output end of the first buffer and a second end coupled to a first node, the first switching element being configured to switch between states based on a first clock signal; a first capacitor including a first end coupled to the first node and a grounded second end; a second switching element including a first end coupled to the first node and a second end coupled to a second node, the second switching element being configured to switch between states based on the first clock signal; a second buffer including an input end coupled to the second node; and a first converter configured to determine a first bit string from a first output from the second buffer.

In the following description, components having substantially the same function and configuration will be assigned the same reference numeral or symbol. For the purpose of distinguishing between elements having the same or substantially the same configurations, the description may add different characters or numerals after their respective reference signs.

1. Embodiments

An embodiment will be described.

1.1 Configuration

1.1.1 Communication System

First, a configuration of a communication system including a receiver device according to an embodiment will be described. FIG. 1 is a block diagram showing an example of a configuration of the communication system including the receiver device according the embodiment.

A communication system 1 is configured to transmit data from one device or circuit to another device or circuit by means of high-speed serial communications. Specifically, the communication system 1 realizes, for example, a communication speed at a level of 128 Gbps. The communication system 1 includes a transmitter device 2, a transmission path 3, and a receiver device 4. The communication system 1 may be configured of a plurality of devices or circuits provided on the same printed substrate, or may be configured of a plurality of devices or circuits provided on different printed substrates.

The transmitter device 2 is configured to send signals TR and/TR to the receiver device 4 via the transmission path 3. The signals TR and/TR are differential signals. The signals TR and/TR are, for example, signals including a plurality of pulse signals. In the signals TR and/TR, data is superimposed on each of the pulse signals. A voltage level of each pulse signal of the signals TR and/TR corresponds to one or more bits of data. The data superimposed on the aforementioned pulse signal is transmitted from the transmitter device 2 to the receiver device 4 via the transmission path 3.

The transmission path 3 is a physical or spatial transmission medium for transmitting the signals TR and/TR to the receiver device 4. The transmission path 3 is, for example, an interconnect configured to couple the transmitter device 2 and the receiver device 4. The transmission path 3 may have various transmission characteristics according to the structure, material, etc. of the transmission medium. The transmission characteristics of the transmission path 3 have, for example, frequency characteristics that involve a loss of gain in a certain frequency band.

The signals TR and/TR sent from the transmitter device 2 pass through the transmission path 3, thereby suffering a loss according to the transmission characteristics of the transmission path 3. This results in an occurrence of an intersymbol interference (ISI) in the signals TR and/TR that have passed through the transmission path 3. Accordingly, the signals TR and/TR that have passed through the transmission path 3 are processed as analog signals at an initial circuit of the receiver device 4. Hereinafter, the signals TR and/TR that have passed through the transmission path 3 and thus suffered a loss will be referred to as "signals RV and/RV".

The receiver device 4 is configured to receive the signals RV and/RV from the transmitter device 2 via the transmission path 3. The receiver device 4 decodes the data superimposed on the signals TR and/TR by the transmitter device 2, based on the signals RV and/RV. The receiver device 4 includes a receiver circuit for correctly decoding the data superimposed on the signals TR and/TR.

The receiver circuit may also be referred to as a "semiconductor integrated circuit".

1.1.2 Receiver Circuit

FIG. 2 is a block diagram showing an example of a configuration of the receiver circuit of the receiver device according to the embodiment.

The receiver device 4 includes, as the receiver circuit, for example, pads P1 and P2, an AFE 10, a TI-ADC 20, a VREFGEN 30, a DSP 40, and a CDR 50.

Each of the pads P1 and P2 is a terminal coupled to the transmission path 3. The example shown in FIG. 2 illustrates a case where the pads P1 and P2 receive the signals RV and/RV, respectively, from the transmitter device 2 via the transmission path 3.

The AFE 10 is an analog front-end. The AFE 10 includes, for example, a continuous time linear equalizer (CTLE) and a variable gain amplifier (VGA). The CTLE is an amplifier circuit with frequency characteristics that compensate for the frequency characteristics of the transmission path 3. The VGA is an amplifier circuit capable of varying its gain. The signals RV and/RV are input from the pads P1 and P2, respectively, to the AFE 10. The AFE 10 performs analog processing on the signals RV and/RV using the CTLE and the VGA. The AFE 10 generates signals Sin and/Sin based on the signals RV and/RV. That is, as with the signals RV and/RV, the signals Sin and/Sin are analog signals. The AFE 10 outputs the Sin and/Sin to the TI-ADC 20.

The TI-ADC 20 is a time-interleaved AD converter. Under the communication system 1 that achieves 128 Gbps, in a case where a bit depth is of 2 bits, the TI-ADC 20 achieves a sampling rate of 64 GS/s, for example. In this case, the TI-ADC 20 has a Nyquist frequency of 32 GHz. The TI-ADC 20 executes processing of converting an analog signal into a digital signal. The signals Sin and/Sin are input to the TI-ADC 20 from the AFE 10. Reference voltages VRp and VRn (VRp/n) are input to the TI-ADC 20 from the VREFGEN 30. Signals CK1 and CK2 are input to the TI-ADC 20 from the CDR 50. Based on the reference signals VRp and VRn and the signals CK1 and CK2, the TI-ADC 20 converts the signals Sin and/Sin into a signal X0. The TI-ADC 20 outputs the signal X0 to the DSP 40. A configuration of the TI-ADC 20 will be discussed later.

The reference voltages VRp and VRn are voltages used by the TI-ADC 20 in processing of converting an analog signal into a digital signal. The TI-ADC 20 generates the signal X0 based on a magnitude relationship between a potential difference between the signals Sin and/Sin and a potential difference between the reference voltages VRp and VRn (VRp−VRn).

The signal CK1 includes $n_{r1}$ clock signals. Herein, $n_{r1}$ is an integer equal to or greater than 1 (e.g., 8). The $n_{r1}$ clock signals of the signal CK1 differ from each other in phase by, for example, at least 360°/$n_{r1}$. Hereinafter, the $n_{r1}$ clock signals in the signal CK1 may also be referred to as, for example, "signals CK_0, . . . , and CK1_($n_{r1}$−1)" to make a distinction therebetween. The frequency of the signal CK1 is lower than the frequency of a clock signal embedded in the signals TR and/TR by the transmitter device 2.

The signal CK2 includes $n_{r2}$ clock signals. Herein, $n_{r2}$ is an integer greater than $n_{r1}$ (e.g., 32). The $n_{r2}$ clock signals of the signal CK2 differ from each other in phase by, for example, at least 360°/$n_{r2}$. Hereinafter, the $n_{r2}$ clock signals in the signal CK2 may also be referred to as, for example, "signals CK2_0, . . . , and CK2 ($n_{r2}$−1)" to make a distinction therebetween. The frequency of the signal CK2 may be equal to or different from the frequency of the clock signal embedded in the signals TR and/TR by the transmitter device 2.

The signal X0 output from the TI-ADC 20 is a digital signal. The signal X0 includes a plurality of continuous digital values. A single digital value included in the signal X0 is sampled from a single symbol of the signals Sin and/Sin based on a single clock signal of the signal CK2 (specifically, an edge of the clock signal). A single digital value is, for example, 8-bit data. A value of each bit of $n_{r2}$ continuous digital values included in the signal X0 is sampled from $n_{r2}$ continuous symbols of the signals Sin and/Sin based on $n_{r2}$ clock signals of the signal CK2. Hereinafter, a cycle in which $n_{r2}$ continuous digital values included in the signal X0 are generated by the TI-ADC 20 will also be simply referred to as a "cycle". The $n_{r2}$ continuous digital values included in the signal X0 will also be referred to as a "single-cycle signal X0".

Also, the $n_{r2}$ continuous digital values included in the signal X0 may also be referred to as, for example, "digital value X0_0, . . . , and X0_($n_{r2}$−1)" to make a distinction therebetween. An 8-bit data string included in a digital value X0_*j* may also be referred to as, for example, a "bit string X0_*j*<7:0>". The bit string X0_*j*<7:0> refers to a data string in which eight bits from the most significant bit (MSB) X0_*j*<7> to the least significant bit (LSB) X0_*j*<0> are arranged in order.

The VREFGEN 30 is a voltage generator. The VREFGEN 30 is configured to generate the reference voltages VRp and VRn.

The DSP 40 is a digital signal processor. The DSP 40 includes, for example, a feed-forward equalizer (FFE), a decision feedback equalizer (DFE), and a data determination circuit. The signal X0 is input to the DSP 40. The DSP 40 executes digitization processing on the signal X0 using, for example, the FFE, the DFE, and the data determination circuit. Specifically, the DSP 40 generates a signal X and data A based on the signal X0. The DSP 40 outputs the signal X and the data A to the CDR 50. The DSP 40 outputs the signal X and the data A to a subsequent processing circuit (not shown). In the subsequent processing circuit, the signal X and the data A are processed. The signal X and the data A output to the CDR 50 and the signal X and the data A output to the subsequent processing circuit (not shown) may be either the same or different.

As with the signal X0, the signal X is a digital signal. A one-cycle signal X is a collection of $n_{r2}$ digital values. The data A is data decoded based on the signal X.

The CDR 50 is a clock data recovery circuit. The signal X and the data A are input to the CDR 50 at each cycle. A reference clock signal CKREF is input to the CDR 50 from, for example, the transmitter device 2. The reference clock signal CKREF may be generated inside the CDR 50 or inside the receiver device 4, independently of the transmitter device 2. The CDR 50 calculates an amount of phase correction of the signals CK1 and CK2 based on the reference clock signal CKREF, the signal X, and the data A. The CDR 50 recovers the signals CK1 and CK2 based on the calculated amount of phase correction. The CDR 50 outputs the recovered signals CK1 and CK2 to the TI-ADC 20 at each cycle. In this manner, the CDR 50 recovers, based on the signal X and the data A generated from the single-cycle signal X0, signals CK1 and CK2, on which the timing of sampling of a subsequent single-cycle signal X0 is based. Such cycle-by-cycle circulation processing by the TI-ADC 20, the DSP 40, and the CDR 50 is also referred to as a "CDR loop".

Hereinafter, a case where (8, 32) is applied as a specific combination of ($n_{r1}$, $n_{r2}$) will be described.

1.1.3 AD Converter

Next, an internal configuration of the AD converter (TI-ADC) included in the receiver circuit according to the embodiment will be described. FIG. 3 is a block diagram showing an example of a configuration of the AD converter included in the receiver circuit according to the embodiment.

The TI-ADC 20 contains an SFE 21 and a plurality of SAR-ADCs 22. The SFE 21 contains an SFEP 21*p* and an SFEN 21*n*. The plurality of SAR-ADCs 22 include 32 SAR-ADCs denoted by 22_0, 22_31. In the example shown in FIG. 3, four SAR-ADCs denoted by 22_0, 22_8, 22_16, and 22_24 are expressed as "SAR-ADCs 22_0+8k" (0≤k≤3). In a similar manner, four SAR-ADCs denoted by 22_1, 22_9, 22_17, and 22_25 are expressed as "SAR-ADCs 22_1+8k". Four SAR-ADCs denoted by 22_2, 22_10, 22_18, and 22_26 are expressed as "SAR-ADCs 22_2+8k". Four SAR-ADCs denoted by 22_3, 22_11, 22_19, and 22_27 are expressed as "SAR-ADCs 22_3+8k". Four SAR-ADCs denoted by 22_4, 22_12, 22_20, and 22_28 are expressed as "SAR-ADCs 22_4+8k". Four SAR-ADCs denoted by 22_5, 22_13, 22_21, and 22_29 are expressed as "SAR-ADCs 22_5+8k". Four SAR-ADCs denoted by 22_6, 22_14, 22_22, and 22_30 are expressed as "SAR-ADCs 22_6+8k". Four SAR-ADCs denoted by 22_7, 22_15, 22_23, and 22_31 are expressed as "SAR-ADCs 22_7+8k".

First, the configuration of SFEP 21*p* will be described.

The SFEP 21*p* is a sampling front end corresponding to the signal Sin. Based on the signal Sin, the SFEP 21*p* outputs 8 types of voltages denoted by VOP_0, VOP_1, VOP_2, VOP_3, VOP_4, VOP_5, VOP_6, and VOP_7.

The SFEP 21*p* includes a plurality of buffers BFP and a plurality of sampling circuits THP. The plurality of sampling circuits THP include eight sampling circuits denoted by THP_0, THP_1, THP_2, THP_3, THP_4, THP_5, THP_6, and THP_7. Each of the buffers BFP is, for example, a buffer having a source follower. The plurality of buffers BFP include four first-stage buffers denoted by BFP_a, BFP_b, BFP_c, and BFP_d, and eight second-stage buffers denoted by BFP_0, BFP_1, BFP_2, BFP_3, BFP_4, BFP_5, BFP_6, and BFP_7. The four first-stage buffers BFP_a to BFP_d, and the eight second-stage buffers BFP_0 to BFP_7 may be equivalent in configuration.

The signal Sin is input to an input end of the first-stage buffer BFP_a. The first-stage buffer BFP_a outputs a voltage VOP_a based on the signal Sin. A first end of the sampling circuit THP_0 and a first end of the sampling circuit THP_4 are coupled to an output end of the first-stage buffer BFP_a.

The signal Sin is input to an input end of the first-stage buffer BFP_b. The first-stage buffer BFP_b outputs a voltage VOP_b based on the signal Sin. A first end of the sampling circuit THP_2 and a first end of the sampling circuit THP_6 are coupled to an output end of the first-stage buffer BFP_b.

The signal Sin is input to an input end of the first-stage buffer BFP_c. The first-stage buffer BFP_c outputs a voltage VOP_c based on the signal Sin. A first end of the sampling circuit THP_1 and a first end of the sampling circuit THP_5 are coupled to an output end of the first-stage buffer BFP_C.

The signal Sin is input to an input end of the first-stage buffer BFP_d. The first-stage buffer BFP_d outputs a voltage VOP_d based on the signal Sin. A first end of the sampling circuit THP_3 and a first end of the sampling circuit THP_7 are coupled to an output end of the first-stage buffer BFP_d.

The sampling circuit THP_0 is configured to perform track processing and hold processing on the voltage VOP_a based on the signal CK1_0. The track processing is to cause a voltage of a node inside a sampling circuit to follow an input voltage. The hold processing is to cause the node inside the sampling circuit to store the input voltage. Specifically, the sampling circuit THP_0 follows the voltage VOP_a in a period having the signal CK1_0 at an "H" level (hereinafter referred to as a "voltage VOP_a with the signal CK1_0 being at the 'H' level"). The sampling circuit THP_0 maintains the voltage VOP_a with the signal CK1_0 being at the "H" level in a period having the signal CK1_0 at an "L" level. An input end of the second-stage buffer BFP_0 is coupled to an output end of the sampling circuit THP_0.

The sampling circuit THP_1 is configured to perform track processing and hold processing on the voltage VOP_c based on the signal CK1_1. Specifically, the sampling circuit THP_1 follows the voltage VOP_c in a period having the signal CK1_1 at an "H" level (hereinafter referred to as a "voltage VOP_c with the signal CK1_1 being at the 'H' level"). The sampling circuit THP_1 maintains the voltage VOP_c with the signal CL1_1 being at the "H" level in a period having the signal CK1_1 at the "L" level. An input end of the second-stage buffer BFP_1 is coupled to an output end of the sampling circuit THP_1.

The sampling circuit THP_2 is configured to perform track processing and hold processing on the voltage VOP_b based on the signal CK1_2. Specifically, the sampling circuit THP_2 follows the voltage VOP_b in a period having the signal CK1_2 at an "H" level (hereinafter referred to as a "voltage VOP_b with the signal CK1_2 being at the 'H' level"). The sampling circuit THP_2 maintains the voltage VOP_b with the signal CK1_2 being at the "H" level in a period having the signal CK1_2 at an "L" level. An input end of the second-stage buffer BFP_2 is coupled to an output end of the sampling circuit THP_2.

The sampling circuit THP_3 is configured to perform track processing and hold processing on the voltage VOP_d based on the signal CK1_3. Specifically, the sampling circuit THP_3 follows the voltage VOP_d in a period having the signal CK1_3 at the "H" level (hereinafter referred to as a "voltage VOP_d with the signal CK1_3 being at the 'H' level"). The sampling circuit THP_3 maintains the voltage VOP_d with the signal CK1_3 being at the "H" level in a period having the signal CK1_3 at the "L" level. An input end of the second-stage buffer BFP_3 is coupled to an output end of the sampling circuit THP_3.

The sampling circuit THP_4 is configured to perform track processing and hold processing on the voltage VOP_a based on the signal CK1_4. Specifically, the sampling circuit THP_4 follows the voltage VOP_a in a period having the signal CK1_4 at the "H" level (hereinafter referred to as a "voltage VOP_a with the signal CK1_4 being at the 'H' level"). The sampling circuit THP_4 maintains the voltage VOP_a with the signal CK1_4 being at the "H" level in a period having the signal CK1_4 at the "L" level. An input end of the second-stage buffer BFP_4 is coupled to an output end of the sampling circuit THP_4.

The sampling circuit THP_5 is configured to perform track processing and hold processing on the voltage VOP_c based on the signal CK1_5. Specifically, the sampling circuit THP_5 follows the voltage VOP_c in a period having the signal CK1_5 at an “H” level (hereinafter referred to as a “voltage VOP_c with the signal CK1_5 being at the ‘H’ level”). The sampling circuit THP_5 maintains the voltage VOP_c with the signal CL1_5 being at the “H” level in a period having the signal CK1_5 at the “L” level. An input end of the second-stage buffer BFP_5 is coupled to an output end of the sampling circuit THP_5.

The sampling circuit THP_6 is configured to perform track processing and hold processing on the voltage VOP_b based on the signal CK1_6. Specifically, the sampling circuit THP_6 follows the voltage VOP_b in a period having the signal CK1_6 at the “H” level (hereinafter referred to as a “voltage VOP_b with the signal CK1_6 being at the ‘H’ level”). The sampling circuit THP_6 maintains the voltage VOP_b with the signal CK1_6 being at the “H” level in a period having the signal CK1_6 at the “L” level. An input end of the second-stage buffer BFP_6 is coupled to an output end of the sampling circuit THP_6.

The sampling circuit THP_7 is configured to perform track processing and hold processing on the voltage VOP_d based on the signal CK1_7. Specifically, the sampling circuit THP_7 follows the voltage VOP_d in a period having the signal CK1_7 at the “H” level (hereinafter referred to as a “voltage VOP_d with the signal CK1_7 being at the ‘H’ level”). The sampling circuit THP_7 maintains the voltage VOP_d with the signal CK1_7 being at the “H” level in a period having the signal CK1_7 at the “L” level. An input end of the second-stage buffer BFP_7 is coupled to an output end of the sampling circuit THP_7.

The second-stage buffer BFP_0 outputs the voltage VOP_0 based on the voltage VOP_a output from the sampling circuit THP_0. The SAR-ADCs 22_0, 22_8, 22_16, and 22_24 are coupled to an output end of the second-stage buffer BFP_0.

The second-stage buffer BFP_1 outputs the voltage VOP_1 based on the voltage VOP_c output from the sampling circuit THP_1. The SAR-ADCs 22_1, 22_9, 22_17, and 22_25 are coupled to an output end of the second-stage buffer BFP_1.

The second-stage buffer BFP_2 outputs the voltage VOP_2 based on the voltage VOP_b output from the sampling circuit THP_2. The SAR-ADCs 22_2, 22_10, 22_18, and 22_26 are coupled to an output end of the second-stage buffer BFP_2.

The second-stage buffer BFP_3 outputs the voltage VOP_3 based on the voltage VOP_d output from the sampling circuit THP_3. The SAR-ADCs 22_3, 22_11, 22_19, and 22_27 are coupled to an output end of the second-stage buffer BFP_3.

The second-stage buffer BFP_4 outputs the voltage VOP_4 based on the voltage VOP_a output from the sampling circuit THP_4. The SAR-ADCs 22_4, 22_12, 22_20, and 22_28 are coupled to an output end of the second-stage buffer BFP_4.

The second-stage buffer BFP_5 outputs the voltage VOP_5 based on the voltage VOP_c output from the sampling circuit THP_5. The SAR-ADCs 22_5, 22_13, 22_21, and 22_29 are coupled to an output end of the second-stage buffer BFP_5.

The second-stage buffer BFP_6 outputs the voltage VOP_6 based on the voltage VOP_b output from the sampling circuit THP_6. The SAR-ADCs 22_6, 22_14, 22_22, and 22_30 are coupled to an output end of the second-stage buffer BFP_6.

The second-stage buffer BFP_7 outputs the voltage VOP_7 based on the voltage VOP_d output from the sampling circuit THP_7. The SAR-ADCs 22_7, 22_15, 22_23, and 22_31 are coupled to an output end of the second-stage buffer BFP_7.

Next, the configuration of the SFEN 21*n* will be described.

The SFEN 21*n* is a sampling front end corresponding to the signal/Sin. Based on the signal/Sin, the SFEN 21*n* outputs 8 types of voltages denoted by VON_0, VON_1, VON_2, VON_3, VON_4, VON_5, VON_6, VON_7, and VON_8. The SFEP 21*p* and the SFEN 21*n* are equivalent in configuration except that input and output are different. That is, although illustration is omitted from FIG. 3, the SFEN 21*n* includes four first-stage buffers denoted by BFN_a to BFN_d, eight sampling circuits denoted by THN_0 to THN_7, and eight second-stage buffers BFN_0 to BFN_7.

The signal/Sin is input to an input end of the first-stage buffer BFN_a. The first-stage buffer BFN_a outputs the voltage VON_a based on the signal/Sin. A first end of the sampling circuit THN_0 and a first end of the sampling circuit THN_4 are coupled to an output end of the first-stage buffer BFN_a.

The signal/Sin is input to an input end of the first-stage buffer BFN_b. The first-stage buffer BFN_b outputs a voltage VON_b based on the signal/Sin. A first end of the sampling circuit THN_2 and a first end of the sampling circuit THN_6 are coupled to an output end of the first-stage buffer BFN_b.

The signal/Sin is input to an input end of the first-stage buffer BFN_c. The first-stage buffer BFN_c outputs a voltage VON_c based on the signal/Sin. A first end of the sampling circuit THN_1 and a first end of the sampling circuit THN_5 are coupled to an output end of the first-stage buffer BFN_C.

The signal/Sin is input to an input end of the first-stage buffer BFN_d. The first-stage buffer BFN_d outputs a voltage VON_d based on the signal/Sin. A first end of the sampling circuit THN_3 and a first end of the sampling circuit THN_7 are coupled to an output end of the first-stage buffer BFN_d.

The sampling circuit THN_0 is configured to perform track processing and hold processing on the voltage VON_a based on the signal CK1_0. Specifically, the sampling circuit THN_0 follows the voltage VON_a in a period having the signal CK1_0 at the “H” level (hereinafter referred to as a “voltage VON_a with the signal CK1_0 being at the ‘H’ level”). The sampling circuit THN_0 maintains the voltage VON_a with the signal CK1_0 being at the “H” level in a period having the signal CK1_0 at the “L” level. An input end of the second-stage buffer BFN_0 is coupled to an output end of the sampling circuit THN_0.

The sampling circuit THN_1 is configured to perform track processing and hold processing on the voltage VON_c based on the signal CK1_1. Specifically, the sampling circuit THN_1 follows the voltage VON_c in a period having the signal CK1_1 at an “H” level (hereinafter referred to as a “voltage VON_c with the signal CK1_1 being at the ‘H’ level”). The sampling circuit THN_1 maintains the voltage VON_c with the signal CK1_1 being at the “H” level in a period having the signal CK1_1 at the “L” level. An input end of the second-stage buffer BFN_1 is coupled to an output end of the sampling circuit THN_1.

The sampling circuit THN_2 is configured to perform track processing and hold processing on the voltage VON_b based on the signal CK1_2. Specifically, the sampling circuit THN_2 follows the voltage VON_b in a period having the signal CK1_2 at the "H" level (hereinafter referred to as a "voltage VON_b with the signal CK1_2 being at the 'H' level"). The sampling circuit THN_2 maintains the voltage VON_b with the signal CK1_2 being at the "H" level in a period having the signal CK1_2 at the "L" level. An input end of the second-stage buffer BFN_2 is coupled to an output end of the sampling circuit THN_2.

The sampling circuit THN_3 is configured to perform track processing and hold processing on the voltage VON_d based on the signal CK1_3. Specifically, the sampling circuit THN_3 follows the voltage VON_d in a period having the signal CK1_3 at the "H" level (hereinafter referred to as a "voltage VON_d with the signal CK1_3 being at the 'H' level"). The sampling circuit THN_3 maintains the voltage VON_d with the signal CK1_3 being at the "H" level in a period having the signal CK1_3 at the "L" level. An input end of the second-stage buffer BFN_3 is coupled to an output end of the sampling circuit THN_3.

The sampling circuit THN_4 is configured to perform track processing and hold processing on the voltage VON_a based on the signal CK1_4. Specifically, the sampling circuit THN_4 follows the voltage VON_a in a period having the signal CK1_4 at the "H" level (hereinafter referred to as a "voltage VON_a with the signal CK1_4 being at the 'H' level"). The sampling circuit THN_4 maintains the voltage VON_a with the signal CK1_4 being at the "H" level in a period having the signal CK1_4 at the "L" level. An input end of the second-stage buffer BFN_4 is coupled to an output end of the sampling circuit THN_4.

The sampling circuit THN_5 is configured to perform track processing and hold processing on the voltage VON_c based on the signal CK1_5. Specifically, the sampling circuit THN_5 follows the voltage VON_c in a period having the signal CK1_5 at the "H" level (hereinafter referred to as a "voltage VON_c with the signal CK1_5 being at the 'H' level"). The sampling circuit THN_5 maintains the voltage VON_c with the signal CK1_5 being at the "H" level in a period having the signal CK1_5 at the "L" level. An input end of the second-stage buffer BFN_5 is coupled to an output end of the sampling circuit THN_5.

The sampling circuit THN_6 is configured to perform track processing and hold processing on the voltage VON_b based on the signal CK1_6. Specifically, the sampling circuit THN_6 follows the voltage VON_b in a period having the signal CK1_6 at the "H" level (hereinafter referred to as a "voltage VON_b with the signal CK1_6 being at the 'H' level"). The sampling circuit THN_6 maintains the voltage VON_b with the signal CK1_6 being at the "H" level in a period having the signal CK1_6 at the "L" level. An input end of the second-stage buffer BFN_6 is coupled to an output end of the sampling circuit THN_6.

The sampling circuit THN_7 is configured to perform track processing and hold processing on the voltage VON_d based on the signal CK1_7. Specifically, the sampling circuit THN_7 follows the voltage VON_d in a period having the signal CK1_7 at the "H" level (hereinafter referred to as a "voltage VON_d with the signal CK1_7 being at the 'H' level"). The sampling circuit THN_7 maintains the voltage VON_d with the signal CK1_7 being at the "H" level in a period having the signal CK1_7 at the "L" level. An input end of the second-stage buffer BFN_7 is coupled to an output end of the sampling circuit THN_7.

The second-stage buffer BFN_0 outputs the voltage VON_0 based on the voltage VON_a output from the sampling circuit THN_0. The SAR-ADCs 22_0, 22_8, 22_16, and 22_24 are coupled to an output end of the second-stage buffer BFN_0.

The second-stage buffer BFN_1 outputs the voltage VON_1 based on the voltage VON_c output from the sampling circuit THN_1. The SAR-ADCs 22_1, 22_9, 22_17, and 22_25 are coupled to an output end of the second-stage buffer BFN_1.

The second-stage buffer BFN_2 outputs the voltage VON_2 based on the voltage VON_b output from the sampling circuit THN_2. The SAR-ADCs 22_2, 22_10, 22_18, and 22_26 are coupled to an output end of the second-stage buffer BFN_2.

The second-stage buffer BFN_3 outputs the voltage VON_3 based on the voltage VON_d output from the sampling circuit THN_3. The SAR-ADCs 22_3, 22_11, 22_19, and 22_27 are coupled to an output end of the second-stage buffer BFN_3.

The second-stage buffer BFN_4 outputs the voltage VON_4 based on the voltage VON_a output from the sampling circuit THN_4. The SAR-ADCs 22_4, 22_12, 22_20, and 22_28 are coupled to an output end of the second-stage buffer BFN_4.

The second-stage buffer BFN_5 outputs the voltage VON_5 based on the voltage VON_c output from the sampling circuit THN_5. The SAR-ADCs 22_5, 22_13, 22_21, and 22_29 are coupled to an output end of the second-stage buffer BFN_5.

The second-stage buffer BFN_6 outputs the voltage VON_6 based on the voltage VON_b output from the sampling circuit THN_6. The SAR-ADCs 22_6, 22_14, 22_22, and 22_30 are coupled to an output end of the second-stage buffer BFN_6.

The second-stage buffer BFN_7 outputs the voltage VON_7 based on the voltage VON_d output from the sampling circuit THN_7. The SAR-ADCs 22_7, 22_15, 22_23, and 22_31 are coupled to an output end of the second-stage buffer BFN_7.

Each of the SAR-ADCs 22_0 to 22_31 is a successive-approximation register AD converter. The SAR-ADCs 22_0 to 22_31 are equivalent in configuration. Signals CK2_0 to CK2_31 are respectively input to the SAR-ADCs 22_0 to 22_31. The reference voltages VRp and VRn are supplied to each of the SAR-ADCs 22_0 to 22_31 via different interconnects. The SAR-ADCs 22_0 to 22_31 respectively output signals X0_0 to X0_31 based on the signals CK2_0 to CK2_31 respectively input thereto and the reference voltages VRp and VRn.

A period during which each of the signals CK2_0, CK2_8, CK2_16, and CK2_24 is at the "H" level is included in a period during which the signal CK1_0 is at the "L" level. A period during which each of the signals CK2_1, CK2_9, CK2_17, and CK2_25 is at the "H" level is included in a period during which the signal CK1_1 is at the "L" level. A period during which each of the signals CK2_2, CK2_10, CK2_18, and CK2_26 is at the "H" level is included in a period during which the signal CK1_2 is at the "L" level. A period during which each of the signals CK2_3, CK2_11, CK2_19, and CK2_27 is at the "H" level is included in a period during which the signal CK1_3 is at the "L" level.

A period during which each of the signals CK2_4, CK2_12, CK2_20, and CK2_28 is at the "H" level is included in a period during which the signal CK1_4 is at the "L" level. A period during which each of the signals CK2_5, CK2_13, CK2_21, and CK2_29 is at the "H" level is included in a period during which the signal CK1_5 is at the "L" level. A period during which each of the signals CK2_6, CK2_14, CK2_22, and CK2_30 is at the "H" level is included in a period during which the signal CK1_6 is at the "L" level. A period during which each of the signals CK2_7, CK2_15, CK2_23, and CK2_31 is at the "H" level is included in a period during which the signal CK1_7 is at the "L" level.

1.1.4 Sampling Front End

Figure 4:
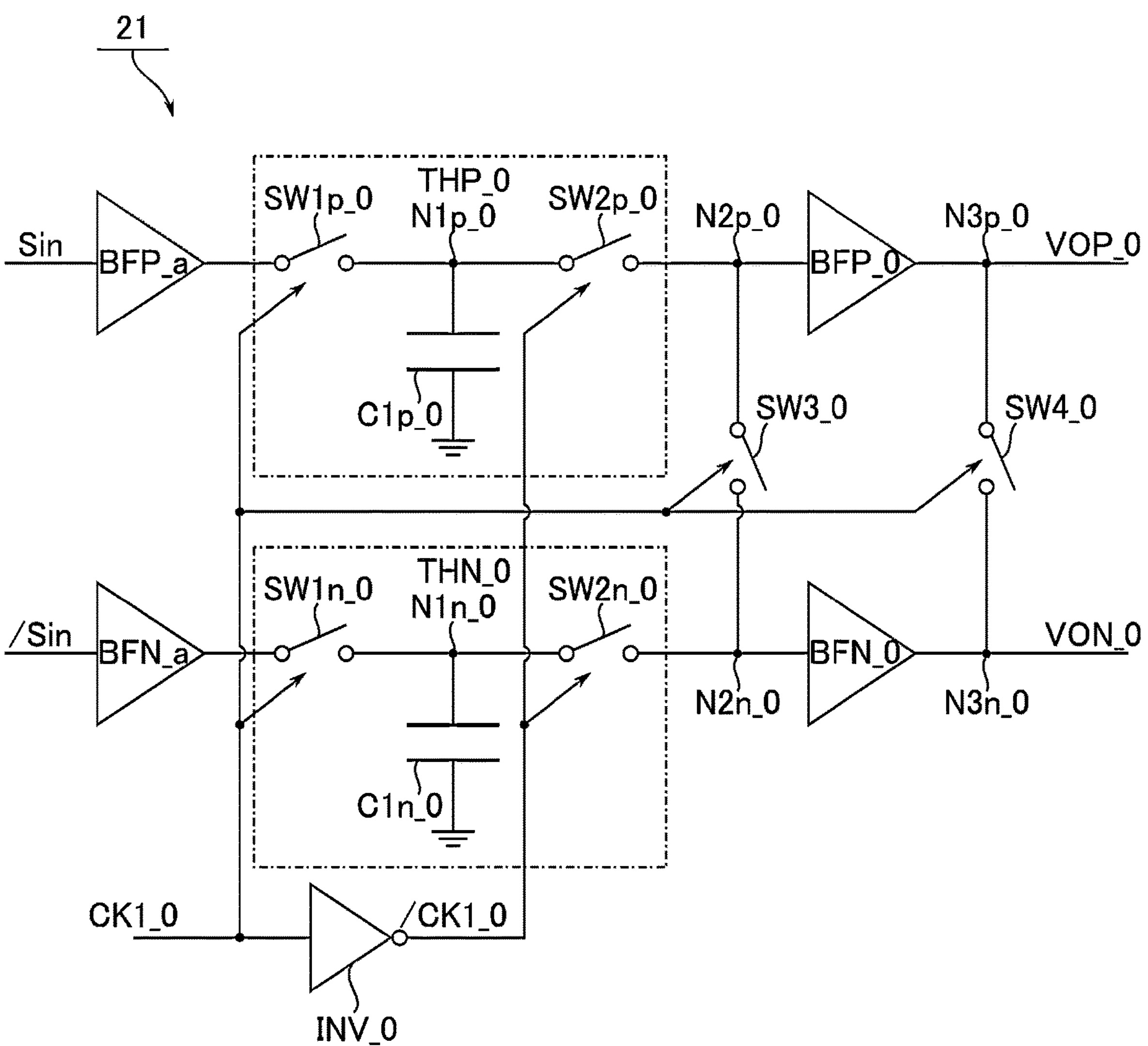
FIG. 4 is a block diagram showing an example of a partial configuration of a sampling front end included in the AD converter according to the embodiment.

FIG. 4 is a block diagram showing an example of a partial configuration of a sampling front end included in an AD converter according to the embodiment. In FIG. 4, of parts of the SFE 21, a part which operates in association with the signal CK1_0 is shown as an example. Parts which respectively operate in association with the signals CK1_1 to CK1_7 are equivalent in configuration to the part which operates in association with the signal CK1_0.

As shown in FIG. 4, the SFE 21 includes, as a part in associated with the signal CK1_0, the first-stage buffers BFP_a and BFN_a, the sampling circuits THP_0 and THN_0, and the second-stage buffers BFP_0 and BFN_0. The sampling circuit THP_0 includes switching elements SW1p_0 and SW2p_0 and a capacitor Clp_0. The sampling circuit THN_0 includes switching elements SW1n_0 and SW2n_0 and a capacitor C1n_0. The SFE 21 further includes, as the part associated with the signal CK1_0, switching elements SW3_0 and SW4_0 and an inverter INV_0.

The switching element SW1p_0 includes a first end coupled to the output end of the first-stage buffer BFP_a and a second end coupled to a node N1p_0. The switching element SW2p_0 includes a first end coupled to the node N1p_0 and a second end coupled to a node N2p_0. The capacitor Clp_0 includes a first end coupled to the node N1p_0 and a grounded second end. Being "grounded" means being coupled to an interconnect to which a reference potential (for example, voltage VSS=0V) at the time of operation of the SFE 21 is applied. Each of the switching elements SW1p_0 and SW2p_0 may be constituted by a transistor.

The switching element SW1n_0 includes a first end coupled to the output end of the first-stage buffer BFN_a and a second end coupled to a node N1n_0. The switching element SW2n_0 includes a first end coupled to the node N1n_0 and a second end coupled to a node N2n_0. The capacitor C1n_0 includes a first end coupled to the node N1n_0 and a grounded second end. Each of the switching elements SW1n_0 and SW2n_0 may be constituted by a transistor.

The switching element SW3_0 includes a first end coupled to the node N2p_0 and a second end coupled to the node N2n_0. The switching element SW4_0 includes a first end coupled to a node N3p_0 and a second end coupled to a node N3n_0. Each of the switching elements SW3_0 and SW4_0 may be constituted by a transistor.

The second-stage buffer BFP_0 includes the input end coupled to the node N2p_0 and the output end coupled to the node N3p_0. The second-stage buffer BFN_0 includes the input end coupled to the node N2n_0 and the output end coupled to the node N3n_0.

The inverter INV_0 is configured to output, based on the signal CK1_0, a signal/CK1_0 which is an inversion signal of the signal CK1_0.

Each of the switching elements SW1p_0, SW1n_0, SW3_0, and SW4_0 is switched between an on state and an off state based on the signal CK1_0. Each of the switching elements SW2p_0 and SW2n_0 is switched between an on state and an off state based on the signal/CK1_0.

1.2 Operation

Next, an operation in the sampling front end according to the embodiment will be described.

1.2.1 Track Processing

FIG. 5 is a diagram showing an example of track processing of a signal at the sampling front end included in the AD converter according to the embodiment. FIG. 5 schematically shows a state of various configurations shown in FIG. 4 during the track processing.

As shown in FIG. 5, the track processing corresponds to operation with the signal CK1_0 being at the "H" level. While the signal CK1_0 is at the "H" level, the switching elements SW1p_0 and SW1n_0 are turned to the on state. By this, the first-stage buffers BFP_a and BFN_a are respectively coupled to the nodes N1p_0 and N1n_0. Therefore, the capacitors Clp_0 and C1n_0 are charged to follow the voltages VOP_a and VON_a.

Meanwhile, while the signal CK1_0 is at the "H" level, the switching elements SW2p_0 and SW2n_0 are turned to the off state. By this, the nodes N2p_0 and N2n_0 are electrically isolated from the nodes N1p_0 and N1n_0, respectively.

Furthermore, while the signal CK1_0 is at the "H" level, the switching elements SW3_0 and SW4n_0 are turned to the on state. By this, the nodes N2p_0 and N2n_0 are electrically coupled to each other. Similarly, the nodes N3p_0 and N3n_0 are electrically coupled to each other.

1.2.2 Hold Processing

Figure 6:
FIG. 6 is a diagram showing an example of hold processing of a signal in the sampling front end included in the AD converter according to the embodiment.
Figure 6:
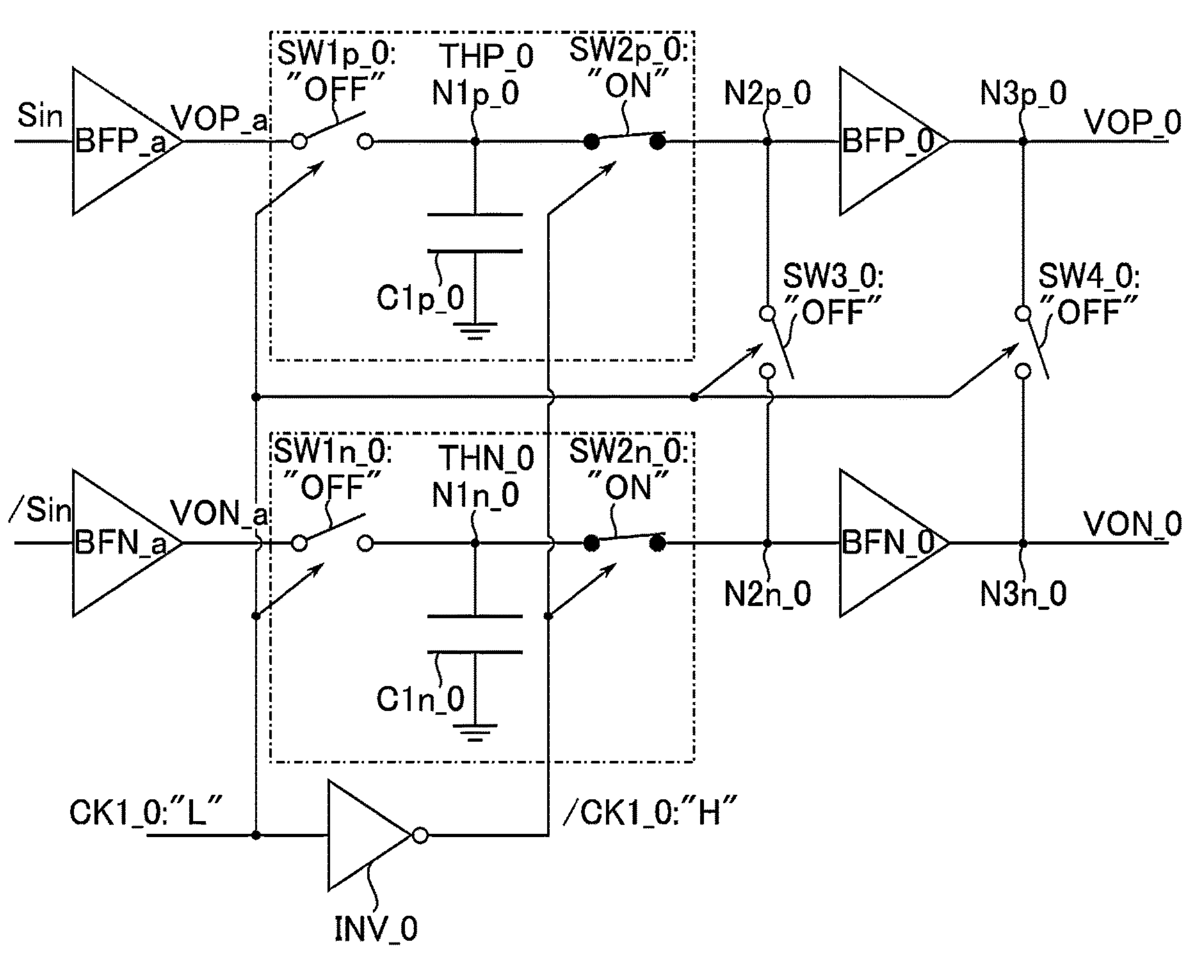

FIG. 6 is a diagram showing an example of hold processing of a signal at the sampling front end included in the AD converter according to the embodiment. FIG. 6 schematically shows a state of various configurations shown in FIG. 4 during the hold processing.

As shown in FIG. 6, the hold processing corresponds to operation with the signal CK1_0 being at the "L" level. While the signal CK1_0 is at the "L" level, the switching elements SW1p_0 and Sw1n_0 are turned to the off state. By this, the nodes N1p_0 and N1n_0 are electrically isolated from the first-stage buffers BFP_a and BFN_a, respectively. Therefore, voltages charged in the capacitors Clp_0 and C1n_0 during the track processing are each maintained during the hold processing.

Meanwhile, while the signal CK1_0 is at the "L" level, the switching elements SW2p_0 and SW2n_0 are turned to the on state. By this, the nodes N2p_0 and N2n_0 are electrically coupled to the nodes N1p_0 and N1n_0, respectively. Therefore, the voltages charged in the capacitors Clp_0 and C1n_0 during the track processing are supplied to the second-stage buffers BFP_0 and BFN_0, respectively.

Furthermore, while the signal CK1_0 is at the "L" level, the switching elements SW3_0 and SW4_0 are turned to the off state. By this, the nodes N2p_0 and N2n_0 are electrically isolated from each other. Similarly, the nodes N3p_0 and N3n_0 are electrically isolated from each other.

1.3. Effects of Present Embodiment

According to the embodiment, while the signal CK1_0 is at the "H" level, the switching elements SW1p_0 and SW1n_0 are turned to the on state and the switching elements SW2p_0 and SW2n_0 are turned to the off state. By this, the capacitor Clp_0 is electrically coupled to the first-stage buffer BFP_a while being electrically isolated from the second-stage buffer BFP_0. This achieves reduction to an extent that a capacitance of the second-stage buffer BFP_0 as viewed from the capacitor Clp_0 and the first-stage buffer BFP_a can be ignored at the time of the track processing. This can prevent a deterioration in a bandwidth of, in particular, a high frequency band of each of the capacitor Clp_0 and the first-stage buffer BFP_a caused by the capacitance of the second-stage buffer BFP_0 in the track processing.

Furthermore, the switching elements SW3_0 and SW4_0 are turned to the on state while the signal CK1_0 is at the "H" level. This causes a short circuit in input ends of the second-stage buffers BFP_0 and BFN_0, thereby uniforming voltages of the input ends of the second-stage buffers BFP_0 and BFN_0 to an intermediate value of the voltages. Similarly, by output ends of the second-stage buffers BFP_0 and BFN_0 being short-circuited, voltages of the output ends of the second-stage buffers BFP_0 and BFN_0 are made to be uniform to an intermediate value of the voltages. As described above, the second-stage buffers BFP_0 and BFN_0 are differential circuits. Therefore, each of the pairs of voltages of the input ends of the second-stage buffers BFP_0 and BFN_0 and voltages of the output ends of the second-stage buffers BFP_0 and BFN_0 can be made to be uniform to an intermediate value of amplitude of a differential signal. This can bring a potential difference between the input ends and a potential difference between the output ends of the second-stage buffers BFP_0 and BFN_0 (that is, a gate-source voltage of a source follower) close to 0.

Furthermore, the switching elements SW3_0 and SW4_0 are turned to the off state while the signal CK1_0 is at the "L" level. By this, the second-stage buffers BFP_0 and BFN_0 are electrically isolated from each other while the signal CK1_0 is at the "L" level. This enables the second-stage buffer BFP_0 to operate based on a voltage charged in the capacitor Clp_0. Similarly, this enables the second-stage buffer BFN_0 to operate based on a voltage charged in the capacitor C1*n*_0. Furthermore, as described above, a potential difference between the input ends and a potential difference between the output ends of the second-stage buffers BFP_0 and BFN_0 are brought close to 0 during the track processing. Therefore, voltages charged in the capacitors Clp_0 and C1*n*_0 during the track processing can be prevented from fluctuating under the influence of a gate-source voltage of the source follower. This can reduce distortion caused in the voltages VOP_0 and VON_0 respectively output from the second-stage buffers BFP_0 and BFN_0.

2. Modifications

The foregoing embodiment is not limited to the above-described examples, and various modifications are applicable.

For example, the foregoing embodiment described the configuration in which the input ends of the second-stage buffers BFP_0 and BFN_0 are short-circuited and also the output ends are short-circuited; however, this configuration is not a limitation.

2.1 First Modification

Figure 7:
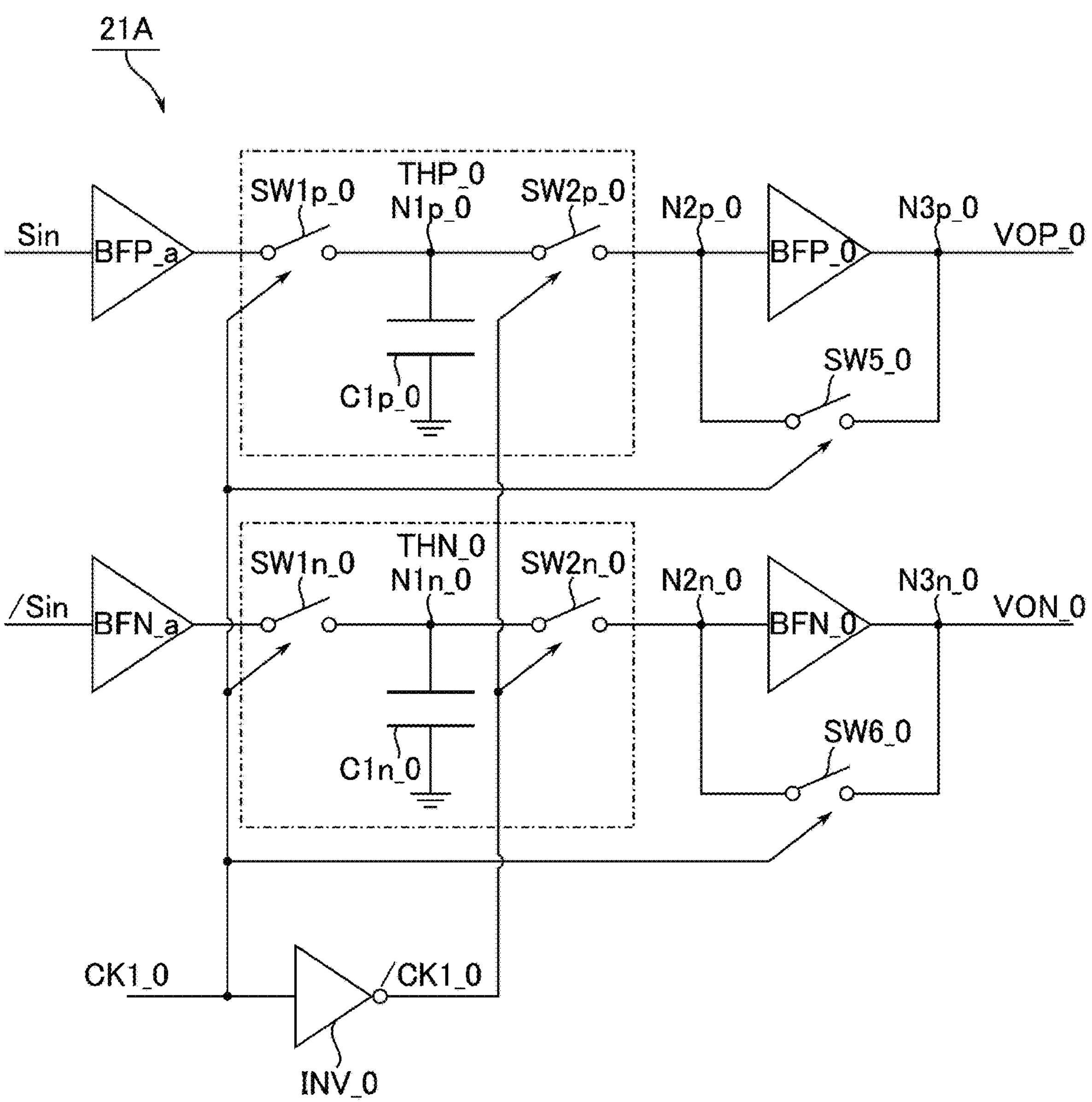
FIG. 7 is a block diagram showing an example of a partial configuration of a sampling front end included in an AD converter according to a first modification.

FIG. 7 is a block diagram showing an example of a partial configuration of a sampling front end included in an AD converter according to a first modification. FIG. 7 corresponds to FIG. 4 of the embodiment.

As shown in FIG. 7, an SFE 21A includes, as a part associated with the signal CK1_0, the first-stage buffers BFP_a and BFN_a, the sampling circuits THP_0 and THN_0, and the second-stage buffers BFP_0 and BFN_0. The SFE 21A further includes, as the part associated with the signal CK1_0, switching elements SW5_0 and SW6_0 and the inverter INV_0.

The first-stage buffers BFP_a and BFN_a, the sampling circuits THP_0 and THN_0, the second-stage buffers BFP_0 and BFN_0, and the inverter INV_0 in the first modification are equivalent in configuration to the first-stage buffers BFP_a and BFN_a, the sampling circuits THP_0 and THN_0, the second-stage buffers BFP_0 and BFN_0, and the inverter INV_0 included in the SFE 21 in the embodiment.

The switching element SW5_0 includes a first end coupled to the node N2*p*_0 and a second end coupled to the node N3*p*_0. The switching element SW6_0 includes a first end coupled to a node N2*n*_0 and a second end coupled to the node N3*n*_0. Each of the switching elements SW5_0 and SW6_0 is switched between an on state and an off state based on the signal CK1_0. In the track processing, the switching elements SW5_0 and SW6_0 are in the on state while the signal CK1_0 is at the "H" level. In the hold processing, the switching elements SW5_0 and SW6_0 are in the off state while the signal CK1_0 is at the "L" level. Each of the elements SW5_0 and SW6_0 is constituted by a transistor.

According to the first modification, by the output end and the input end of the second-stage buffer BFP_0 being short-circuited at the time of the track processing, a voltage of the input end of the second-stage buffer BFP_0 and a voltage of the output end thereof are made to be uniform to an intermediate value of the voltages of the input end and the output end. Similarly, by the output end and the input end of the second-stage buffer BFN_0 being short-circuited at the time of the track processing, a voltage of the input end of the second-stage buffer BFN_0 and a voltage of the output end thereof are made to be uniform to an intermediate value of the voltages of the input end and the output end. By this, the voltage of the input end of the second-stage buffers BFP_0 and the voltage of the output end thereof can be made to be uniform to an intermediate value amplitude of a signal. Similarly, the voltage of the input end of the second-stage buffers BFN_0 and the voltage of the output end thereof can be made to be uniform to an intermediate value amplitude of a signal. This can bring a potential difference between the input end and the output end of each of the second-stage buffers BFP_0 and BFN_0 close to 0 during the track processing. As with the embodiment, this can reduce distortion caused in the voltages VOP_0 and VON_0 respectively output from the second-stage buffers BFP_0 and BFN_0.

2.2 Second Modification

Figure 8:
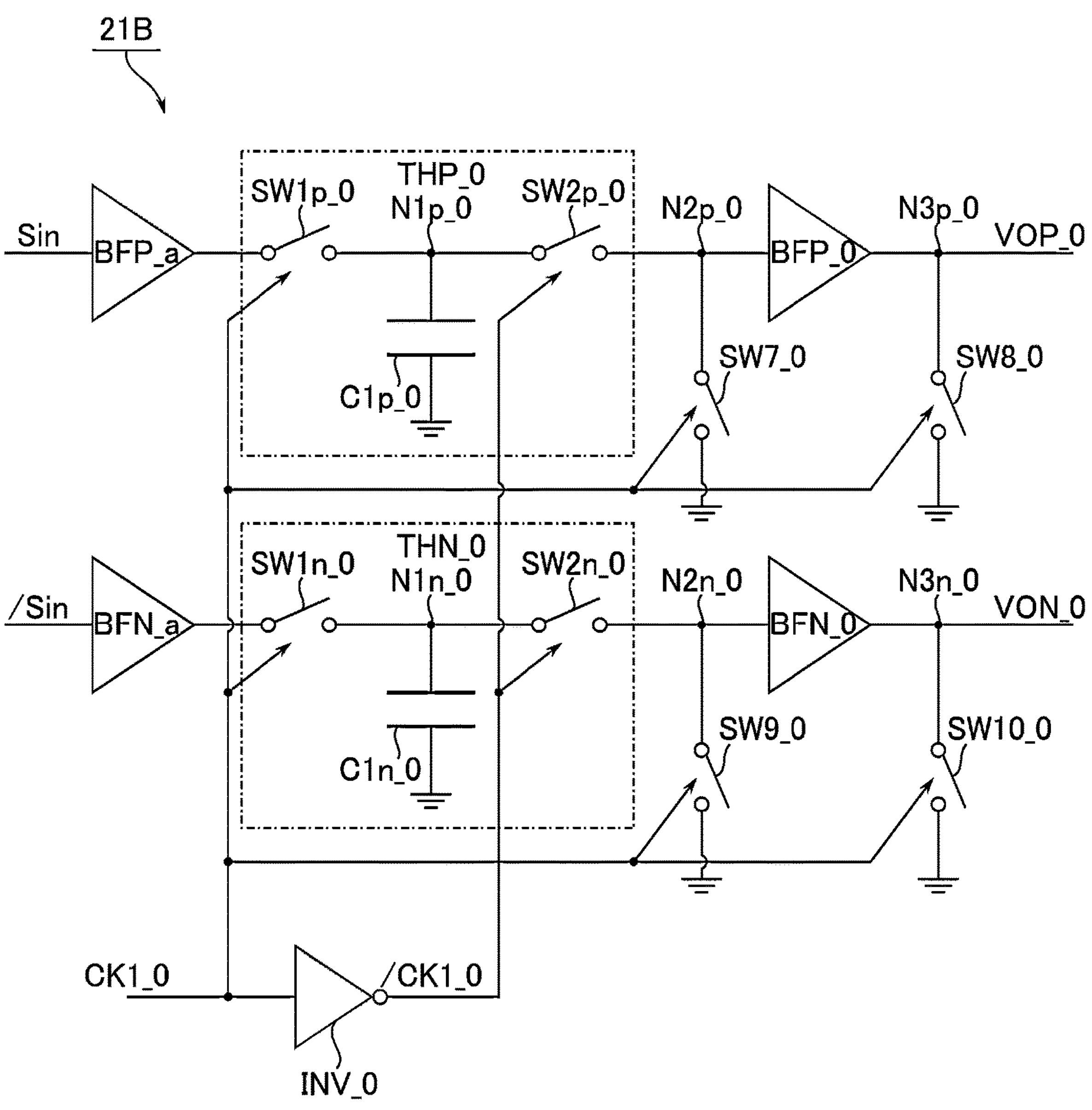
FIG. 8 is a block diagram showing an example of a partial configuration of a sampling front end included in an AD converter according to a second modification.

FIG. 8 is a block diagram showing an example of a partial configuration of a sampling front end included in an AD converter according to a second modification. FIG. 8 corresponds to FIG. 4 of the embodiment.

As shown in FIG. 8, an SFE 21B includes, as a part associated with the signal CK1_0, the first-stage buffers BFP_a and BFN_a, the sampling circuits THP_0 and THN_0, and the second-stage buffers BFP_0 and BFN_0. The SFE 21B further includes, as the part associated with the signal CK1_0, switching elements SW7_0, SW8_0, SW9_0, and SW10_0 and the inverter INV_0.

The first-stage buffers BFP_a and BFN_a, the sampling circuits THP_0 and THN_0, the second-stage buffers BFP_0 and BFN_0, and the inverter INV_0 in the second modification are equivalent in configuration to the first-stage buffers BFP_a and BFN_a, the sampling circuits THP_0 and THN_0, the second-stage buffers BFP_0 and BFN_0, and the inverter INV_0 included in the SFE 21 in the embodiment.

The switching element SW7_0 includes a first end coupled to the node N2*p*_0 and a grounded second end. The switching element SW8_0 includes a first end coupled to the node N3*p*_0 and a grounded second end. The switching element SW9_0 includes a first end coupled to the node N2*n*_0 and a grounded second end. The switching element SW10_0 includes a first end coupled to the node N3*n*_0 and a grounded second end. Each of the switching elements SW7_0, SW8_0, SW9_0, and SW10_0 is switched between an on state and an off state based on the signal CK1_0. In the track processing, each of the switching elements SW7_0, SW8_0, SW9_0, and SW10_0 is in the on state while the signal CK1_0 is at the "H" level. In the hold processing, each of the switching elements SW7_0, SW8_0, SW9_0, and SW10_0 is in the off state while the signal CK1_0 is at the "L" level. Each of the elements SW7_0, SW8_0, SW9_0, and SW10_0 is constituted by a transistor.

According to the second modification, the input end and the output end of the second-stage buffer BFP_0 and the input end and the output end of the second-stage buffer BFN_0 are grounded at the time of track processing. By this, all of the voltage of the input end and the voltage of the output end of the second-stage buffer BFP_0, and the voltage of the input end and the voltage of the output end of the second-stage buffer BFN_0 are made to be uniform to 0 V. This can bring a potential difference between the input end and the output end of the second-stage buffer BFP_0 close to 0 during the track processing. Similarly, this can bring a potential difference between the input end and the output end of the second-stage buffer BFN_0 close to 0 during the track processing. As with the embodiment, this can reduce distortion caused in the voltages VOP_0 and VON_0 respectively output from the second-stage buffers BFP_0 and BFN_0.

Some or all of the embodiments described above can be described as in the following supplementary notes, but are not limited thereto:

Supplementary Note 1

A semiconductor integrated circuit comprising:

a first buffer including an input end to which a first signal is configured to be supplied;

a first switching element including a first end coupled to an output end of the first buffer and a second end coupled to a first node, the first switching element being configured to switch between states based on a first clock signal;

a first capacitor including a first end coupled to the first node and a grounded second end;

a second switching element including a first end coupled to the first node and a second end coupled to a second node, the second switching element being configured to switch between states based on the first clock signal;

a second buffer including an input end coupled to the second node; and a first converter configured to determine a first bit string from a first output from the second buffer.

Supplementary Note 2

The semiconductor integrated circuit according to supplementary note 1, wherein the first switching element is configured to be turned to an on state in a case where the first clock signal is at a first logical level, and to be turned to an off state in a case where the first clock signal is at a second logical level different from the first logical level, and the second switching element is configured to be turned to an off state in the case where the first clock signal is at the first logical level, and to be turned to an on state in the case where the first clock signal is at the second logical level.

Supplementary Note 3

The semiconductor integrated circuit according to supplementary note 2, wherein the first converter is configured to determine the first bit string from the first output based on a second clock signal, and a period during which the second clock signal is at the first logical level is included in a period in which the first clock signal is at the second logical level.

Supplementary Note 4

The semiconductor integrated circuit according to supplementary note 3, further comprising a second converter configured to determine a second bit string from the first output based on a third clock signal shifted by a first phase from the second clock signal, wherein a period during which the third clock signal is at the first logical level is included in the period in which the first clock signal is at the second logical level.

Supplementary Note 5

The semiconductor integrated circuit according to supplementary note 1, further comprising:

a thirteenth switching element including a first end coupled to an output end of the first buffer and a second end coupled to a fifth node, the thirteenth switching element being configured to switch between states based on a fourth clock signal shifted by a second phase from the first clock signal;

a third capacitor including a first end coupled to the fifth node and a grounded second end;

a fourteenth switching element including a first end coupled to the fifth node and a second end coupled to a sixth node, the fourteenth switching element being configured to switch between states based on the fourth clock signal;

a fifth buffer including an input end coupled to the sixth node; and a third converter configured to determine a third bit string from a third output from the fifth buffer.

Supplementary Note 6

The semiconductor integrated circuit according to supplementary note 5, wherein the first switching element is configured to be turned to an on state in a case where the first clock signal is at a first logical level, and to be turned to an off state in a case where the first clock signal is at a second logical level different from the first logical level, the second switching element is configured to be turned to an off state in the case where the first clock signal is at the first logical level, and to be turned to an on state in the case where the first clock signal is at the second logical level, the thirteenth switching element is configured to be turned to an on state in a case where the fourth clock signal is at the first logical level, and to be turned to an off state in a case where the fourth clock signal is at the second logical level, and the fourteenth switching element is configured to be turned to an off state in the case where the fourth clock signal is at the first logical level, and to be turned to an on state in the case where the fourth clock signal is at the second logical level.

Supplementary Note 7

The semiconductor integrated circuit according to supplementary note 1, further comprising:

a sixth buffer including an input end to which the first signal is configured to be supplied;

a fifteenth switching element including a first end coupled to an output end of the sixth buffer and a second end coupled to a seventh node, the fifteenth switching element being configured to switch between states based on a fifth clock signal shifted by a third phase from the first clock signal;

a fourth capacitor including a first end coupled to the seventh node and a grounded second end;

a sixteenth switching element including a first end coupled to the seventh node and a second end coupled to an eighth node, the sixteenth switching element being configured to switch between states based on the fifth clock signal;

a seventh buffer including an input end coupled to the eighth node; and a fourth converter configured to determine a fourth bit string from a fourth output from the seventh buffer.

Supplementary Note 8

The semiconductor integrated circuit according to supplementary note 7, wherein the first switching element is configured to be turned to an on state in a case where the first clock signal is at a first logical level, and to be turned to an off state in a case where the first clock signal is at a second logical level different from the first logical level, the second switching element is configured to be turned to an off state in the case where the first clock signal is at the first logical level, and to be turned to an on state in the case where the first clock signal is at the second logical level, the fifteenth switching element is configured to be turned to an on state in a case where the fifth clock signal is at the first logical level, and to be turned to an off state in a case where the fifth clock signal is at the second logical level, and the sixteenth switching element is configured to be turned to an off state in the case where the fifth clock signal is at the first logical level, and to be turned to an on state in the case where the fifth clock signal is at the second logical level.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A semiconductor integrated circuit comprising:

a first buffer including an input end to which a first signal is configured to be supplied;

a first switching element including a first end coupled to an output end of the first buffer and a second end coupled to a first node, the first switching element being configured to switch between states based on a first clock signal;

a first capacitor including a first end coupled to the first node and a grounded second end;

a second switching element including a first end coupled to the first node and a second end coupled to a second node, the second switching element being configured to switch between states based on the first clock signal;

a second buffer including an input end coupled to the second node;

a third buffer including an input end to which a second signal is configured to be supplied, the first signal and the second signal constituting differential signals;

a third switching element including a first end coupled to an output end of the third buffer and a second end coupled to a third node, the third switching element being configured to switch between states based on the first clock signal;

a second capacitor including a first end coupled to the third node and a grounded second end;

a fourth switching element including a first end coupled to the third node and a second end coupled to a fourth node, the fourth switching element being configured to switch between states based on the first clock signal;

a fourth buffer including an input end coupled to the fourth node; and a first converter configured to determine a first bit string from a first output from the second buffer and a second output from the fourth buffer.

2. The semiconductor integrated circuit according to claim 1, wherein the first switching element is configured to be turned to an on state in a case where the first clock signal is at a first logical level, and to be turned to an off state in a case where the first clock signal is at a second logical level different from the first logical level, and the second switching element is configured to be turned to an off state in the case where the first clock signal is at the first logical level, and to be turned to an on state in the case where the first clock signal is at the second logical level.

3. The semiconductor integrated circuit according to claim 1, wherein the first switching element and the third switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

4. The semiconductor integrated circuit according to claim 1, further comprising:

a fifth switching element including a first end coupled to the second node and a second end coupled to the fourth node, the fifth switching element being configured to switch between states based on the first clock signal; and a sixth switching element including a first end coupled to an output end of the second buffer and a second end coupled to an output end of the fourth buffer, the sixth switching element being configured to switch between states based on the first clock signal.

5. The semiconductor integrated circuit according to claim 4, wherein the first switching element, the third switching element, the fifth switching element, and the sixth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

6. The semiconductor integrated circuit according to claim 1, further comprising:

a seventh switching element including a first end coupled to the second node and a second end coupled to an output end of the second buffer, the seventh switching element being configured to switch between states based on the first clock signal; and an eighth switching element including a first end coupled to the fourth node and a second end coupled to an output end of the fourth buffer, the eighth switching element being configured to switch between states based on the first clock signal.

7. The semiconductor integrated circuit according to claim 6, wherein the first switching element, the third switching element, the seventh switching element, and the eighth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

8. The semiconductor integrated circuit according to claim 1, further comprising:

a ninth switching element including a first end coupled to the second node and a grounded second end, the ninth switching element being configured to switch between states based on the first clock signal;

a tenth switching element including a first end coupled to an output end of the second buffer and a grounded second end, the tenth switching element being configured to switch between states based on the first clock signal;

an eleventh switching element including a first end coupled to the fourth node and a grounded second node, the eleventh switching element being configured to switch between states based on the first clock signal; and a twelfth switching element including a first end coupled to an output end of the fourth buffer and a grounded second end, the twelfth switching element being configured to switch between states based on the first clock signal.

9. The semiconductor integrated circuit according to claim 8, wherein the first switching element, the third switching element, the ninth switching element, the tenth switching element, the eleventh switching element, and the twelfth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

10. A receiver device comprising:

a semiconductor integrated circuit; and a processing circuit configured to process a signal output from the semiconductor integrated circuit, wherein the semiconductor integrated circuit includes:

a first buffer including an input end to which a first signal is configured to be supplied;

a first switching element including a first end coupled to an output end of the first buffer and a second end coupled to a first node, the first switching element being configured to switch between states based on a first clock signal;

a first capacitor including a first end coupled to the first node and a grounded second end;

a second switching element including a first end coupled to the first node and a second end coupled to a second node, the second switching element being configured to switch between states based on the first clock signal;

a second buffer including an input end coupled to the second node;

a third buffer including an input end to which a second signal is configured to be supplied, the first signal and the second signal constituting differential signals;

a third switching element including a first end coupled to an output end of the third buffer and a second end coupled to a third node, the third switching element being configured to switch between states based on the first clock signal;

a second capacitor including a first end coupled to the third node and a grounded second end;

a fourth switching element including a first end coupled to the third node and a second end coupled to a fourth node, the fourth switching element being configured to switch between states based on the first clock signal;

a fourth buffer including an input end coupled to the fourth node; and a first converter configured to determine a first bit string from a first output from the second buffer and a second output from the fourth buffer.

11. The receiver device according to claim 10, wherein the first switching element is configured to be turned to an on state in a case where the first clock signal is at a first logical level, and to be turned to an off state in a case where the first clock signal is at a second logical level different from the first logical level, and the second switching element is configured to be turned to an off state in the case where the first clock signal is at the first logical level, and to be turned to an on state in the case where the first clock signal is at the second logical level.

12. The receiver device according to claim 10, wherein the first switching element and the third switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

13. The receiver device according to claim 10, wherein the semiconductor integrated circuit further comprises:

a fifth switching element including a first end coupled to the second node and a second end coupled to the fourth node, the fifth switching element being configured to switch between states based on the first clock signal; and a sixth switching element including a first end coupled to an output end of the second buffer and a second end coupled to an output end of the fourth buffer, the sixth switching element being configured to switch between states based on the first clock signal.

14. The receiver device according to claim 13, wherein the first switching element, the third switching element, the fifth switching element, and the sixth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

15. The receiver device according to claim 10, wherein the semiconductor integrated circuit further comprises:

a seventh switching element including a first end coupled to the second node and a second end coupled to an output end of the second buffer, the seventh switching element being configured to switch between states based on the first clock signal; and an eighth switching element including a first end coupled to the fourth node and a second end coupled to an output end of the fourth buffer, the eighth switching element being configured to switch between states based on the first clock signal.

16. The receiver device according to claim 15, wherein the first switching element, the third switching element, the seventh switching element, and the eighth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

17. The receiver device according to claim 10, wherein the semiconductor integrated circuit further comprises:

a ninth switching element including a first end coupled to the second node and a grounded second end, the ninth switching element being configured to switch between states based on the first clock signal;

a tenth switching element including a first end coupled to an output end of the second buffer and a grounded second end, the tenth switching element being configured to switch between states based on the first clock signal;

an eleventh switching element including a first end coupled to the fourth node and a grounded second node, the eleventh switching element being configured to switch between states based on the first clock signal; and a twelfth switching element including a first end coupled to an output end of the fourth buffer and a grounded second end, the twelfth switching element being configured to switch between states based on the first clock signal.

18. The receiver device according to claim 17, wherein the first switching element, the third switching element, the ninth switching element, the tenth switching element, the eleventh switching element, and the twelfth switching element are configured to be turned to an on state in a case where the first clock signal is at a first logical level, and to be turned to an off state in a case where the first clock signal is at a second logical level different from the first logical level, and the second switching element and the fourth switching element are configured to be turned to an off state in the case where the first clock signal is at the first logical level, and to be turned to an on state in the case where the first clock signal is at the second logical level.

* * * * *